United States Patent [19]
Denny et al.

[11] 4,001,699
[45] Jan. 4, 1977

[54] BAR GRAPH DIGITAL INTERFACE CIRCUIT

[75] Inventors: William Michael Denny, Santa Barbara; Russell Louis Hagen, Goleta; Steve Ka-Lai Leung, Santa Barbara, all of Calif.

[73] Assignee: Burroughs Corporation, Detroit, Mich.

[22] Filed: Sept. 15, 1975

[21] Appl. No.: 613,326

[52] U.S. Cl. .............................. 328/71; 328/72; 328/37; 328/48; 328/121; 340/324 R
[51] Int. Cl.² ................ H03K 13/258; H03K 17/00
[58] Field of Search ............. 328/37, 48, 121, 123, 328/124, 72, 71; 340/324 R

[56] References Cited
UNITED STATES PATENTS

| | | | |
|---|---|---|---|
| 3,299,313 | 1/1967 | Giacchi | 328/48 X |
| 3,424,986 | 1/1969 | Vasseur | 328/48 |
| 3,657,658 | 4/1972 | Kubo | 328/48 X |
| 3,660,842 | 5/1972 | Ballantyne | 328/48 X |
| 3,818,354 | 6/1974 | Tomisawa et al. | 328/48 X |
| 3,824,379 | 7/1974 | Tomisawa et al. | 328/48 X |

*Primary Examiner*—John S. Heyman
*Attorney, Agent, or Firm*—Nathan Cass; Kevin R. Peterson; Edward J. Feeney, Jr.

[57] ABSTRACT

A circuit for controlling the height of a bar graph display in response to a digital input signal. A first count, representing the particular cathode segment of the bar graph under energization, is developed by a counter which monitors the clock signal driving the bar graph display. A second count is developed by a counter stepped by a clock when the digital input signal is in a selected logic state. At the end of a selected interval, the counters contents are transferred to a register for supply to a digital comparator, which compares the first and second counts and produces a control signal upon their equality.

8 Claims, 2 Drawing Figures

BAR GRAPH DIGITAL INTERFACE CIRCUIT

BACKGROUND OF THE INVENTION

This invention relates generally to circuitry for energizing gaseous displays and more particularly to circuitry for energizing a bar graph display from a digital input.

In the bar graph display associated with the present invention, a series of linearly arranged cathode elements are sequentially energized by phased clocking circuitry. As long as a unitary anode element overlying the cathode elements is energized, sequential illumination occurs, forming a bar display. The height of the bar is then determined by properly de-energizing the overlying anode.

In the prior art, this de-energization of the anode electrode has been typically controlled by a voltage comparator circuit. The comparator is supplied with an analog voltage level representing bar height and with a ramp signal. When the ramp exceeds the analog level, the bar graph anode is de-energized. Using this analog approach, digital information must be converted to analog form in order to be displayed. Such techniques have proven burdensome and unduly expensive when it is desired to display digital output in a bar graph format.

SUMMARY OF THE INVENTION

It is therefore an object of the invention to improve circuitry for interfacing between digital signals and a bar graph display.

It is another object of the invention to employ an entirely digital approach in such interfacing circuitry to eliminate the need for analog conversion.

These and other objects and advantages are achieved according to the invention by utilizing a digital comparator to compare a first count representing the particular bar graph cathode element being energized to a second count representing the length of time that a monitored digital input signal is in a selected logic state.

BRIEF DISCUSSION OF THE DRAWINGS

A particular manner of implementing the above summarized invention will now be detailed by a discussion of the preferred embodiment of the invention undertaken in conjunction with the drawings of which:

DETAILED DESCRIPTION OF THE PREFERRED EMBODIMENT

Figure 1:
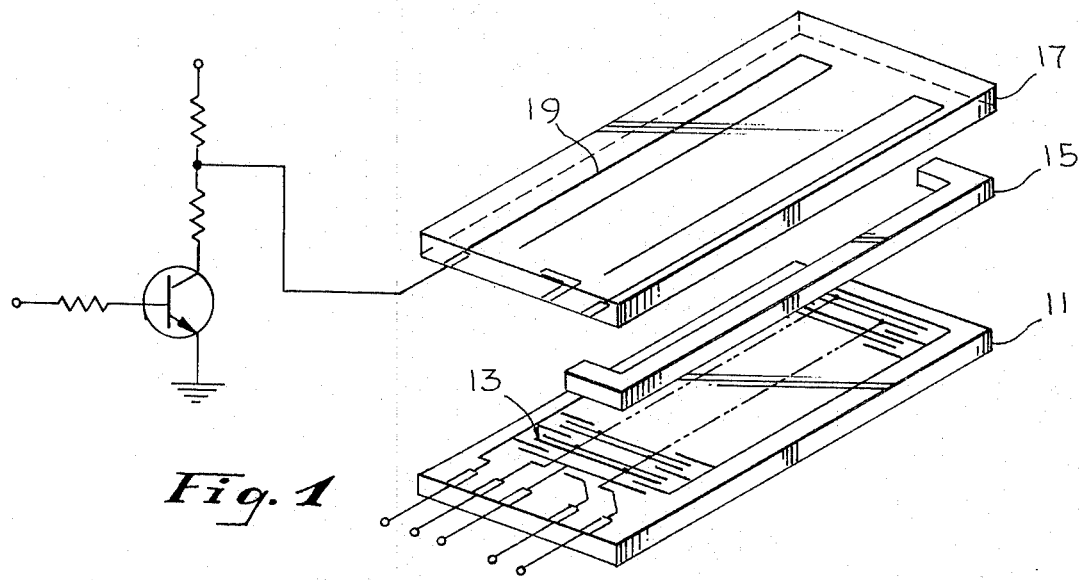
FIG. 1 is a pictorial illustration of a bar graph of the type used in conjunction with the preferred embodiment of the invention.

A particular bar graph structure is shown in FIG. 1. The bar graph comprises a series of screened cathode segments 13 residing on a ceramic substrate 11. A cover plate 17 is placed over the substrate 11 and separated therefrom by a spacer 15. The underside of the cover plate 17 contains a long, unitary anode 19 for interacting with the cathode segments 13.

In operation, each of the cathode segments 13 is successively energized. As long as the anode 19 is activated, glow propagates up the serial row of cathode segments 13. The height to which the glow rises is determined by the duration of activation of the anode electrode 19. To provide a constant display, sequential scanning of the cathode segments 13 is conducted 60 or more times per second, i.e. at a frequency of 60 Hz or more. The duration of activation of the anode element 19 must therefore be synchronized with the cycle of cathode activation in order to maintain proper bar height in the display.

Figure 2:
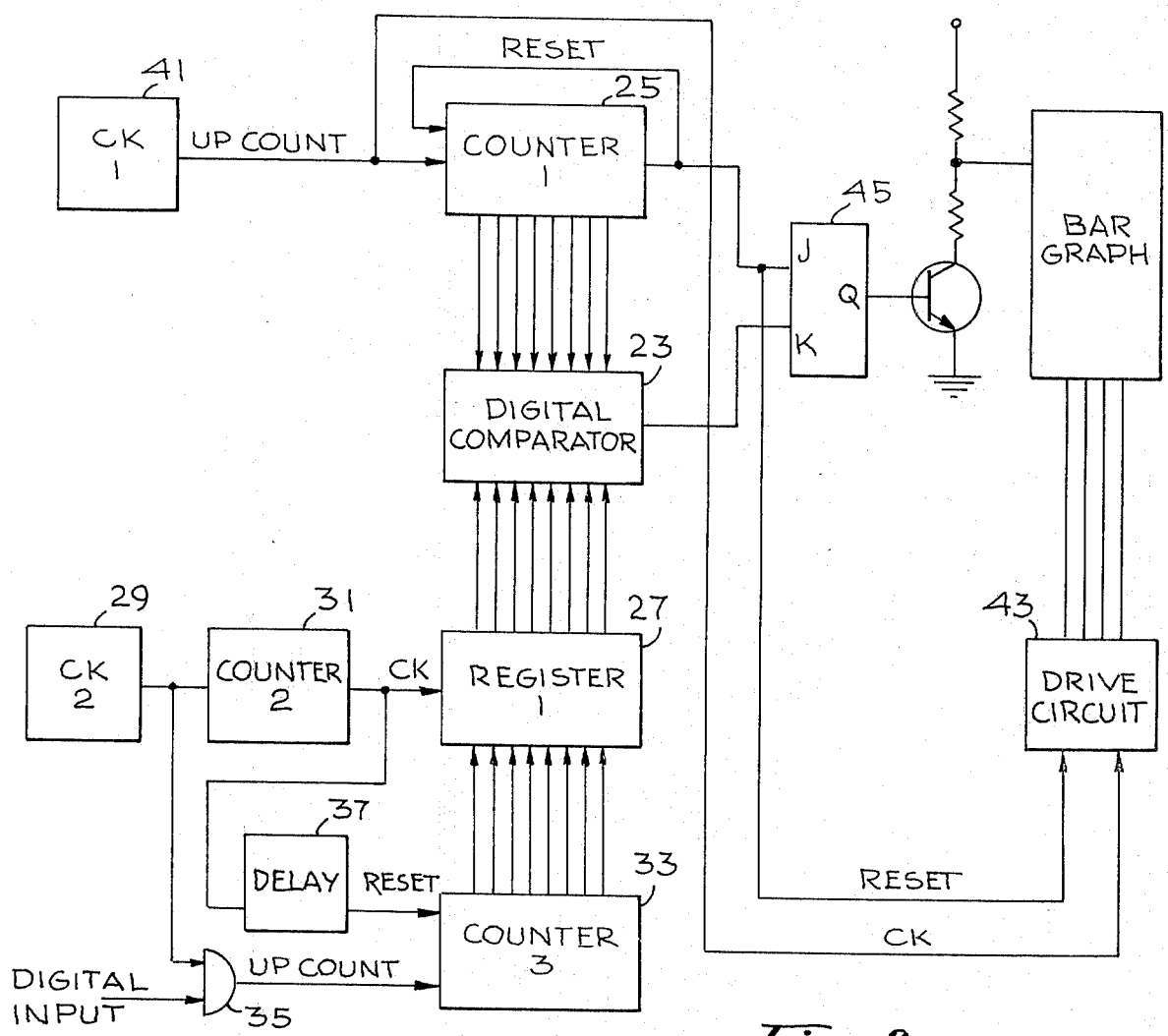
FIG. 2 is a schematic of the preferred embodiment of the invention.

According to the invention, proper synchronization of activating signals to the anode electrode 19 is provided by the digital circuitry of FIG. 2. That circuitry includes a digital comparator 23 which compares the digital output of a first counter 25 and a register 27. The contents of the register 27 indicate the time interval during which the anode element 19 is to be activated, and the output of the counter 25 represents the particular cathode segment 13 under activation at any instant.

The contents of the register 27 is developed and controlled by circuitry including a clock 29, which steps a second counter 31 and a third counter 33. This circuitry also includes an AND gate 35 for controlling the transmission of clock pulses to the counter 33 and delay means 37 for controlling reset of the counter 33.

The clock 29 is set to a frequency of (E) $(2^N)$ where E equals the number of cathode segments 13 in the bar graph and N equals 0, 1, 2, 3 . . . Both second and third counters 31, 33 are long enough to store (E) $(2^N)$. However, the output lines from the third counter 33 to the register 27 are restricted to the highest order bit position of the third counter 33 and those successive decending bit positions necessary to represent E.

Stepping of the third counter 33 by the clock 29 is controlled by the digital input signal to the AND gate 35. It is this digital input which is to be displayed in bar format on the bar graph display. Thus, the length of time that the digital input signal to the AND gate 35 is high determines the number of clock pulses delivered to the third counter 33.

At the same time that the counter 33 is being stepped by the clock 29, the second counter 31 is counting and reaches (E) $(2^N)$ after an interval of one second. At that time the contents of the third counter 33 are transferred to the register 27 and a reset signal delayed by delaying means 37 resets the third counter 33. In this manner, the register 27 is supplied every second with a new indication of the number of segments 13 to be activated, and hence a new indication of bar height.

The counter 25 is stepped by a second clock 41 at a frequency of (S)(E) Hz where E equals the number of cathode segments and S is the frequency of sequential scanning of the cathode elements 13. This frequency drives the counter 25 and is also supplied to the drive circuitry 43, which utilized it to develop signals for sequentially activating the cathode elements 13.

The counter 25 is adapted to count to E and thereupon reset. It therefore completes S such counts in a one second interval. For example, if the scanning frequency S is 60 Hz, the counter 25 will count to E 60 times per second.

The count of the counter 25 indicates the particular element 13 of the bar graph which is under activation by the drive circuit 43. This count increments until it reaches the bar height indication stored in the register 27. At this time, the digital comparator 23 activates a flip-flop 45 which de-activates the anode electrode in the bar graph, thus determining the bar height displayed. When the count of the first counter 25 is completed, the flip-flop 45 is reset to prepare for the next one of the sequential energizations of the cathode segments 13.

As may be apparent, many modifications in the preferred embodiment described above may be made without departing from the scope and spirit of the invention. It is therefore to be understood that, within the scope of the appended claims, the invention may be practiced other than as particularly described.

What is claimed is:

1. Display interface circuitry responsive to a selected logic state of a digital input signal for producing a control signal for controlling a bar graph display including a plurality of sequentially activated cathode segments cooperating with a single anode element comprising:
   first count producing means for producing a first count indicating the particular cathode segment under activation at any time;
   second count producing means for producing a second count proportional to the duration of said digital signal in said selected logic state; and
   means for comparing said first count to said second count and producing said control signal upon their equivalence;
   said second count producing means including:
   first clock means for producing a first clock signal having a frequency equal to the product of the total number of said plurality of cathode segments and $2^N$ where N equals an integer 0, 1, 2, 3 . . . ;
   logic means supplied with said first clock signal for producing sampling clock pulses when said digital signal is in said selected logic state; and
   first counter means for counting said sampling clock pulses; and
   said first count producing means comprising:
   second clock means for producing second clock pulses of a frequency equal to the produce of the total number of said plurality of cathode segments and the number of times per second said plurality of cathode segments is to be sequentially energized;
   second counter means for counting a number of said second clock pulses equal to the total number of said plurality of cathode segments and thereafter resetting;
   said second count producing means further including:
   third counter means driven by said first clock signal for counting to the product of $2^N$ and the total number of said plurality of cathode elements and thereupon producing a reset signal;
   register means responsive to said reset signal for storing at least the high order count bits of said second counter means necessary to represent the total number of said plurality of cathode elements; and
   delay means activated by said reset signal for resetting said second counter means after said storing.

2. The display interface circuitry of claim 1 wherein said comparing means comprises:
   digital comparator means for comparing the count of said first counter means with the bits in said register means and for producing said control signal upon their equivalence.

3. The combination of a bar graph display and display interface circuitry responsive to a selected logic state of a digital input signal for producing a control signal for controlling the height of said bar graph display in accordance with the length of time that said digital input signal is in said selected logic state;
   said bar graph display including a plurality of sequentially activated cathode segments cooperating with a single anode element; and
   said display interface circuitry comprising:
   first count producing means for producing a first count indicating the particular cathode segment of said bar graph display which is under activation at any time;
   second count producing means for producing a second count proportional to the duration of said digital signal in said selected logic state, said second count producing means including means for updating said second count at a predetermined cyclic rate; and
   comparing means for comparing said first count to said second count and producing said control signal upon their equivalence; and
   means for applying said control signal to said bar graph display along with said first count from said first count producing means for controlling the height of said bar graph.

4. The display interface circuitry of claim 3 wherein said first count producing means comprises:
   clock means for producing clock pulses of a frequency equal to the product of the total number of said plurality of cathode segments and the number of times per second said plurality of cathode segments are to be sequentially energized; and
   counter means for counting a number of said clock pulses equal to the total number of said cathode segments and thereafter resetting.

5. The display interface circuitry of claim 3 wherein said second count producing means also includes:
   first clock means for producing a first clock signal having a frequency equal to the product of the total number of said plurality of cathode segments and $2^N$ where N equals an integer 0, 1, 2, 3 . . . ;
   logic means supplied with said first clock signal for producing sampling clock pulses when said digital signal is in said selected logic state; and
   first counter means for counting said sampling clock pulses.

6. The display interface circuitry of claim 5 wherein said first count producing means comprises:
   second clock means for producing second clock pulses of a frequency equal to the product of the total number of said plurality of cathode segments and the number of times per second said plurality of cathode segments is to be sequentially energized;
   second counter means for counting a number of said second clock pulses equal to the total number of said plurality of cathode segments and thereafter resetting.

7. The display interface circuitry of claim 6 wherein said means for updating includes third counter means driven by said first clock signal for counting to the product of $2^N$ and the total number of said plurality of cathode elements and thereupon producing a reset signal, and wherein said second count producing means further includes:
   register means responsive to said reset signal for storing at least the high order count bits of said second counter means necessary to represent the total number of said plurality of cathode elements; and delay means activated by said reset signal for resetting said second counter means after said storing.

8. The display interface circuitry of claim 7 wherein said comparing means comprises:

digital comparator means for comparing the count of said first counter means with the bits in said register means and for producing said control signal upon their equivalence.

* * * * *